United States Patent
Doering et al.

(10) Patent No.: US 7,560,713 B2
(45) Date of Patent: Jul. 14, 2009

(54) CORRECTION LENS SYSTEM FOR A PARTICLE BEAM PROJECTION DEVICE

(75) Inventors: Hans-Joachim Doering, Jena (DE); Thomas Elster, Jena (DE)

(73) Assignee: Vistec Electron Beam GmbH, Jena (DE)

( * ) Notice: Subject to any disclaimer, the term of this patent is extended or adjusted under 35 U.S.C. 154(b) by 289 days.

(21) Appl. No.: 11/587,234

(22) PCT Filed: Feb. 24, 2005

(86) PCT No.: PCT/EP2005/050781

§ 371 (c)(1),
(2), (4) Date: Oct. 23, 2006

(87) PCT Pub. No.: WO2005/104169

PCT Pub. Date: Nov. 3, 2005

(65) Prior Publication Data

US 2007/0215812 A1    Sep. 20, 2007

(30) Foreign Application Priority Data

Apr. 23, 2004   (DE)   ................. 10 2004 019 834

(51) Int. Cl.
*G21K 5/10*   (2006.01)
*H01J 37/08*   (2006.01)

(52) U.S. Cl. ............... 250/492.22; 250/282; 430/30

(58) Field of Classification Search .......... 250/396 ML, 250/492.2, 492.22, 492.23, 400
See application file for complete search history.

(56) References Cited

U.S. PATENT DOCUMENTS

| | | | |
|---|---|---|---|
| 4,376,249 A | | 3/1983 | Pfeiffer et al. |
| 4,544,847 A | | 10/1985 | Taylor |
| 4,779,046 A | | 10/1988 | Rouberoi et al. |
| 5,973,333 A | * | 10/1999 | Nakasuji et al. ........ 250/492.23 |
| 6,005,250 A | | 12/1999 | Stickel et al. |
| 6,008,498 A | | 12/1999 | Simizu |
| 6,011,268 A | | 1/2000 | Nakasuji |
| 6,180,947 B1 | * | 1/2001 | Stickel et al. ......... 250/396 ML |
| 6,222,197 B1 | | 4/2001 | Kojima |
| 6,630,681 B1 | * | 10/2003 | Kojima .................. 250/492.22 |
| 6,657,207 B2 | * | 12/2003 | Kawata et al. ........... 250/492.2 |
| 2001/0030289 A1 | * | 10/2001 | Fukui ......................... 250/400 |
| 2002/0084422 A1 | * | 7/2002 | Kienzle et al. ........ 250/396 ML |
| 2008/0121810 A1 | * | 5/2008 | Liu et al. .............. 250/396 ML |
| 2008/0210887 A1 | * | 9/2008 | Buschbeck et al. ....... 250/492.2 |

FOREIGN PATENT DOCUMENTS

DE    0 870 316    2/2003

OTHER PUBLICATIONS

Patent Abstracts of Japan, Publication No. 2001-244167 published Sep. 7, 2001, Hitachi Ltd., "System and Method for Electron Beam Lithography and Method of Manufacturing Electromagnetic Coil" Appln. No. 2000-050028 filed Feb. 25, 2000.

* cited by examiner

*Primary Examiner*—Nikita Wells
*Assistant Examiner*—Johnnie L Smith
(74) *Attorney, Agent, or Firm*—Reed Smith LLP

(57) ABSTRACT

A correction lens system for a particle beam projection device with at least a first magnetic lens and a second magnetic lens is disclosed. A plurality of correction lens pairs is arranged between the first magnetic lens and second magnetic lens and the particle beam.

7 Claims, 8 Drawing Sheets

CORRECTION LENS SYSTEM FOR A PARTICLE BEAM PROJECTION DEVICE

CROSS-REFERENCE TO RELATED APPLICATIONS

This application claims priority of International Application No. PCT/EP2005/050781, filed Feb. 24, 2005 and German Application No. 10 2004 019 834.9, filed Apr. 23, 2004, the complete disclosures of which are hereby incorporated by reference.

BACKGROUND OF THE INVENTION a) Field of the Invention

The invention is directed to a correction lens system for a particle beam projection device. In particular, the invention is directed to a correction lens system for a particle beam projection device having at least a first magnetic lens and a second magnetic lens.

b) Description of the Related Art

European Patent EP 0 870 316 B1 discloses a multipart magnetic lens with concentric bore holes, conical pole pieces, and a deflecting unit. The lens is axially symmetric, and the conical geometry of the bottom part of the lens allows the magnetic lens field to be moved very close to the substrate. However, the lens does not provide the possibility of separate adjustment of the parameters for focusing, scale change and beam rotation. Usually, slow pole piece lenses are used for rotating the beam. Further, the method for minimizing the eddy currents caused by the focusing lenses in the pole pieces of the pole piece lenses by compensation of the external field was not known heretofore.

OBJECT AND SUMMARY OF THE INVENTION

It is the primary object of the invention to provide a fast magnetic correction lens system for a particle beam projection device for exposing substrates (e.g., wafers) which makes it possible to adjust the focus of the particle beam on the target surface, the rotation of the particle beam and the imaging scale.

This object is met through a correction lens system for a particle beam projection device comprising at least a first magnetic lens, a second magnetic lens and a plurality of correction lens pairs which is arranged between the first magnetic lens and the second magnetic lens and the particle beam.

It is particularly advantageous that the correction is carried out in the course of exposure while the object moves continuously. The advantage of the arrangement according to the invention is that the focusing, the imaging scale and the rotation of the beam can be adjusted continuously. The three functions of focusing, imaging scale and beam rotation can be carried out separately while the other two functions are maintained constant. The focusing may have to do with space charge refocusing or refocusing as a result of a slight change in height of the object in the course of exposure (residual unevenness in the wafer, table height errors). Said functions are carried out very quickly, and the eddy currents in the interior of the pole piece of the lenses should cause no retardation if possible.

It is advantageous when a correction lens system for a particle beam projection device is provided. The particle beam projection device comprises at least a first magnetic lens and a second magnetic lens. A plurality of correction lens pairs is arranged between the first and second magnetic lenses and the particle beam. It has proven particularly advantageous to provide a first, a second and a third correction lens pair. Each pair of correction lenses comprises a fast correction coil and a compensation coil.

The correction lens pairs are arranged in such a way that the correction coil of each correction lens pair is arranged closer to the particle beam than the respective associated compensation coil.

The subject matter of the invention is shown schematically in the drawings and is described in the following with reference to the figures.

DESCRIPTION OF THE PREFERRED EMBODIMENTS

Figure 1:
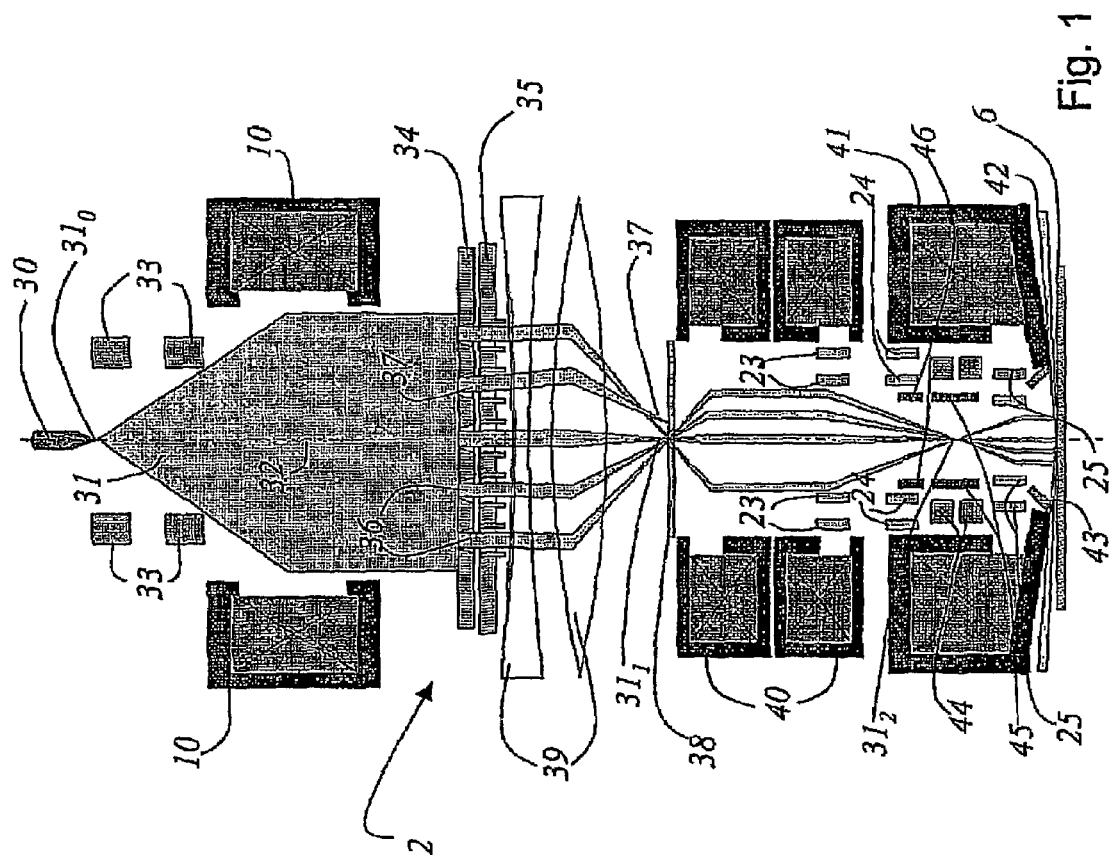
FIG. 1 shows a schematic view of the construction of an entire particle beam column.

FIG. 1 shows the basic beam path in a particle optics projection system 2. The following description is directed to the particle optics projection system 2, wherein the particles are electrons. An electron beam 31 is generated by an electron gun (particle gun) 30 and propagates in direction of an electron-optical axis 32. The electrons exiting from the electron gun 30 have a source crossover $31_0$. A beam centering device 33 which orients the electron beam 31 symmetrically around the optical axis 32 is arranged downstream of the electron gun 30. After the beam centering device, the electron beam 31 traverses an illumination condenser 10 which forms a parallel beam from the initially divergent electron beam 31. The beam formed by the illumination condenser 10 has a diameter over which the intensity is homogeneously distributed. An aperture plate 34 with a plurality of openings for generating many parallel beam bundles 36 is provided following the illumination condenser 10. The deflecting plate 35 which has a plurality of beam deflecting units follows in the propagation direction of the beam bundle 36 in the direction of the target 6. Following the deflecting plate 35 is an acceleration lens 39 which increases the energy of the electrons in the electron beam 31 and then generates a first intermediate image of the crossover 311 at the location of the aperture diaphragm 38. All individual crossovers of the partial beam bundles 36 occur almost at the same location, namely, at the opening of the aperture diaphragm 38. The diameter of the opening of the aperture diaphragm 38 is selected in such a way that almost all electrons of the beam bundles 36 which are not deflected can pass through the aperture diaphragm 38. Individual beams 37 which undergo an individual change in direction through the deflecting plate 35 are stopped at the aperture diaphragm 38 because their crossover intermediate image does not occur at the location of the blanking diaphragm aperture. Farther along the beam path there follows at least one magnetic lens 40 for the purpose of reduced imaging of the aperture plate 34 on the target 6. Two magnetic lenses 40 are shown in the present embodiment example.

A second intermediate image of the crossover 312 is formed during the imaging. Before striking the target 6, e.g., a wafer, the undeflected beam bundles 36 pass through an objective lens 41. The objective lens 41 is outfitted with a plurality of elements. Before and after a second crossover 312 of the electron beam 31, two deflecting devices 45 and 46 are provided. The deflecting devices 45 and 46 serve for deflection and for determining the position of the electron beam 31 or of the plurality of undeflected beam bundles 36 in the target. The two independently controllable deflecting systems 45 and 46 are advantageously used for arranging slow and fast deflecting processes separately in an optimal manner. Fast deflecting processes in the MHz to GHz frequency range are required, e.g., to maintain constant the position of the reduced aperture plate 34 on the uniformly moving target 6 for the duration of an exposure step by means of sawtooth-shaped deflection and, subsequently, to jump to the next exposure point within a very short time. Since neighboring pixels are typically at a distance of less than 100 nm, the fast deflecting system 46 is preferably constructed as an electrostatic system. A slow but highly accurate magnetic deflecting system 45 is preferably used for compensating low-frequency positional deviations of the target 6 from the uniform movement in the range of a few micrometers. Further, stigmators 44 which are preferably constructed as multi-layer magnetic coil systems are provided to compensate for astigmatisms and distortions caused in the optical column by manufacturing tolerances and adjustment errors. The objective lens 41 has a height measurement system 42 which scans the landing point of the electron beam at the target 6. The height measurement system serves to detect unevenness in the target 6 (e.g., wafer) and variations in height that can be caused by the displacement table. A detector 43 for the particles which are backscattered by the target 6 is located near the beam incidence point. This detector 43 serves to determine positions of marks on a target 6 for the purpose of aligning a plurality of exposure planes or calibrating control elements of an exposure system. Further, three pairs of correction lenses 23, 24, 25 are located in the lower area of the projection system of the corpuscular optical column. The correction lenses 23, 24, 25 serve for dynamic correction of the focus, the image field size and the image field rotation during the exposure of the continuously moving target 6. The correction lens system 23, 24, 25 makes it possible to correct errors that may be brought about by height variations of the target and by variable space charge in the column area.

Figure 2:
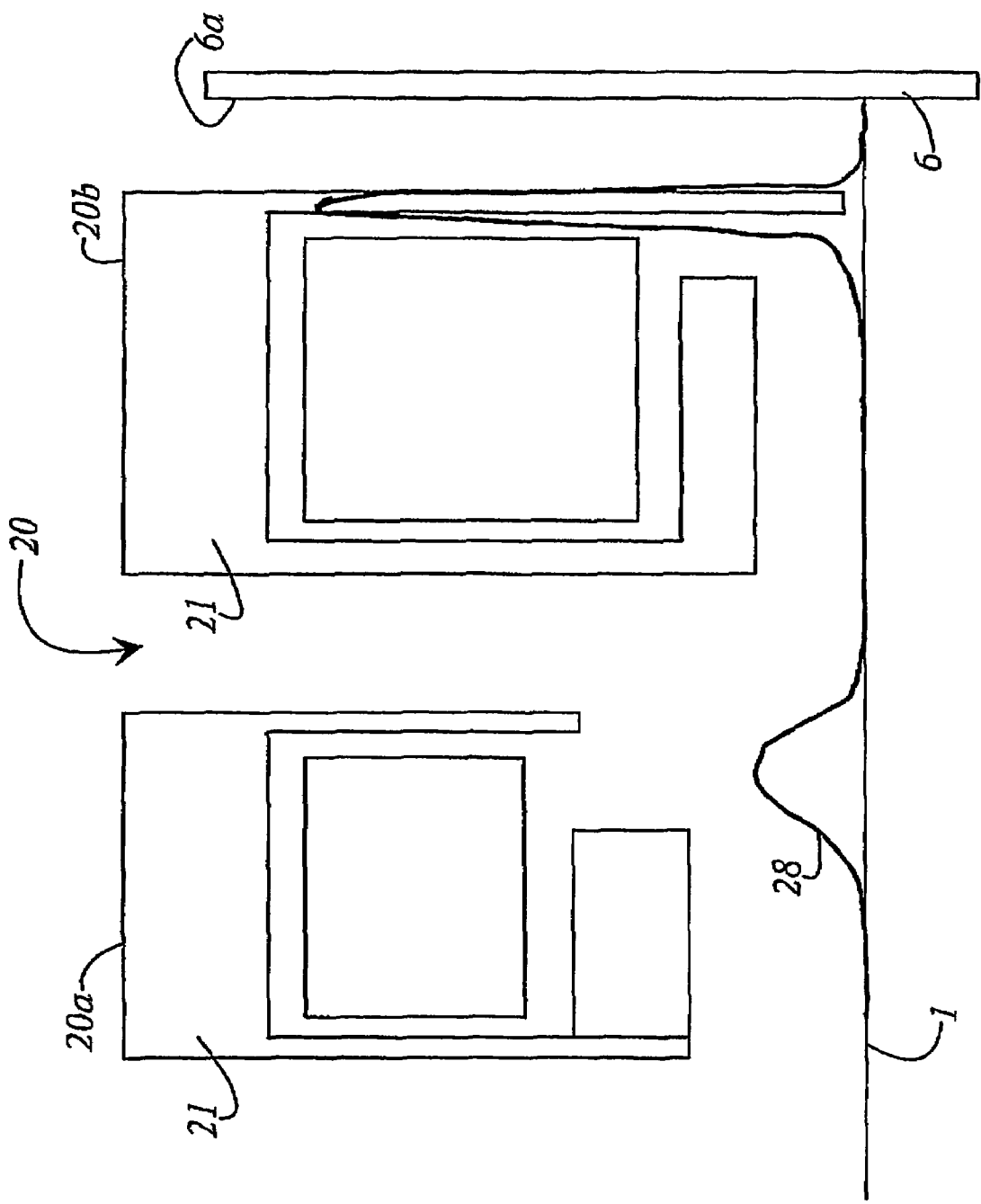
FIG. 2 is a schematic view of the bottom part of the particle optics projection system, preferably with magnetic lenses.
Figure 3:
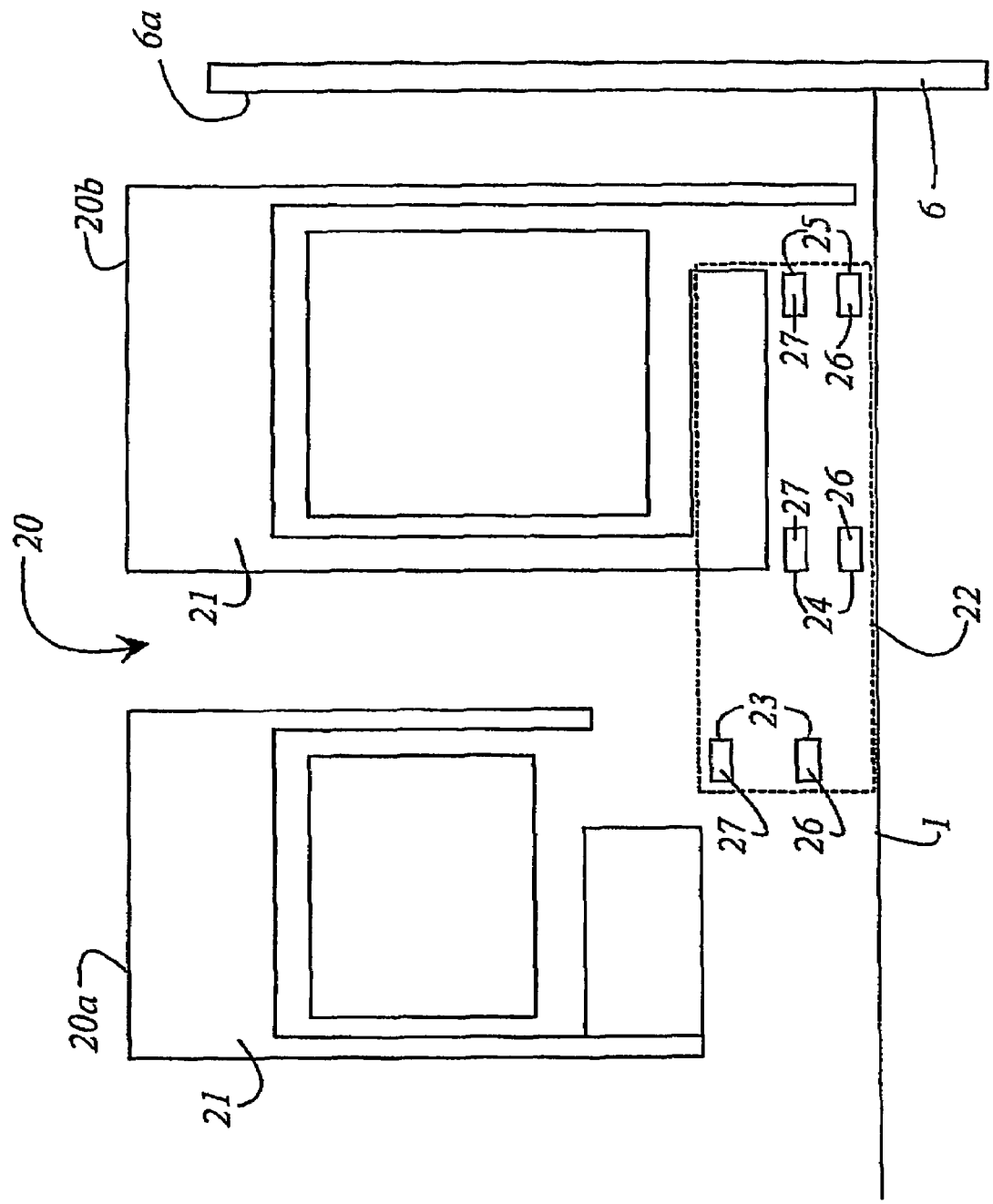
FIG. 3 is a schematic view of the arrangement of a plurality of correction lenses, each with an associated compensation coil.

FIG. 2 shows a schematic view of the particle optics projection system 20 preferably with a first magnetic lens 20a and a second magnetic lens 20b. The first magnetic lens 20a and second magnetic lens 20b are arranged in the beam path of the corpuscular optical projection optics. (Imaging of the object (mask or multiple-beam modulator) on the target plane or target surface 6a). The first magnetic lens 20a and second magnetic lens 20b each preferably comprise two pole pieces 21. FIG. 2 and FIG. 3 show only the first magnetic lens 20a and second magnetic lens 20b on one side of the particle beam 1. The lenses 20a and 20b are arranged in a rotationally-symmetric manner around the particle beam 1. The magnetic axial field strength 28 generated by the first magnetic lens 20a and second magnetic lens 20b is shown in FIG. 2 on the axis defined by the particle beam 1.

FIG. 3 shows the arrangement of the correction lens system 22 according to the invention which is indicated in FIG. 3 by a box in dashed lines. The correction lens system 22 comprises a plurality of correction lens pairs 23, 24 or 25. As is shown in this embodiment form, the correction lens system 22 comprises a first, second and third correction lens pair 23, 24, and 25. The three correction lens pairs 23, 24 and 25 are constructed as pairs of air core coils. Each correction lens pair 23, 24 or 25 comprises a fast correction coil 26 and a compensation coil 27. The correction coil 26 of each correction lens pair 23, 24 and 25 is arranged closer to the particle beam 1 than the compensation coil 27 associated with the correction coil 26.

Figure 4:
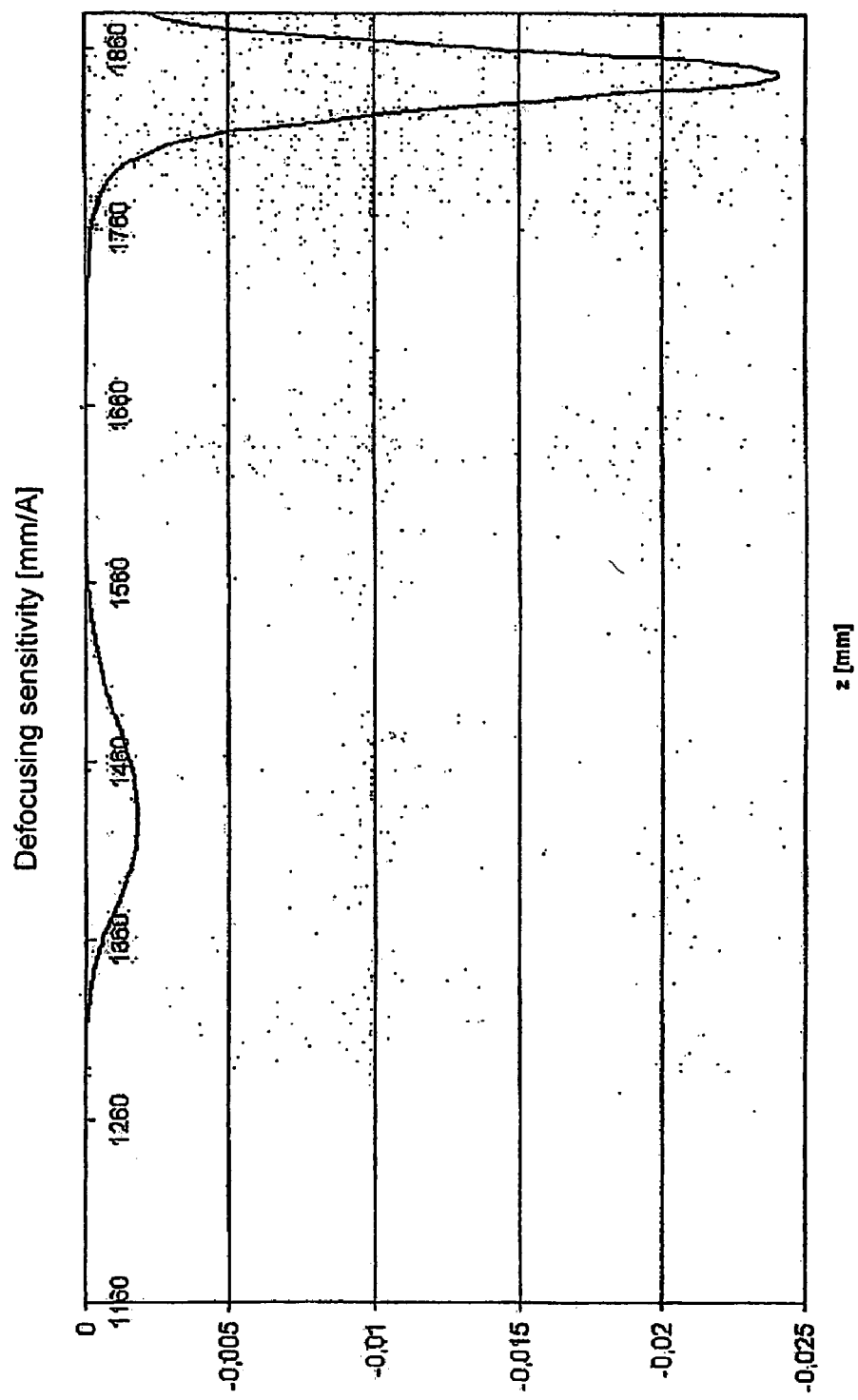
FIG. 4 shows the curve of the focusing sensitivity in different positions of a focusing lens stage.
Figure 5:
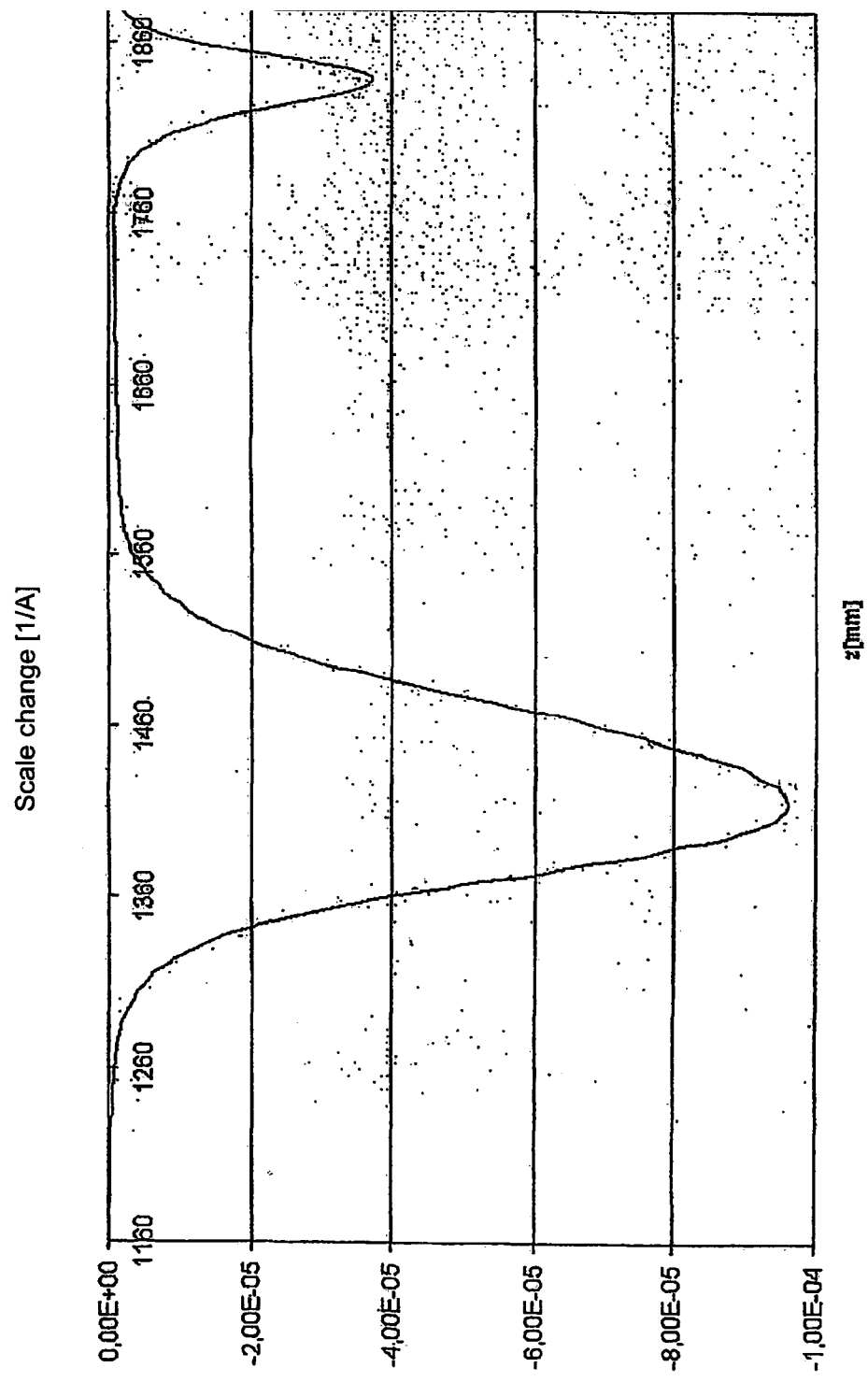
FIG. 5 shows the curve of the scale sensitivity in different positions of a focusing lens stage.
Figure 6:
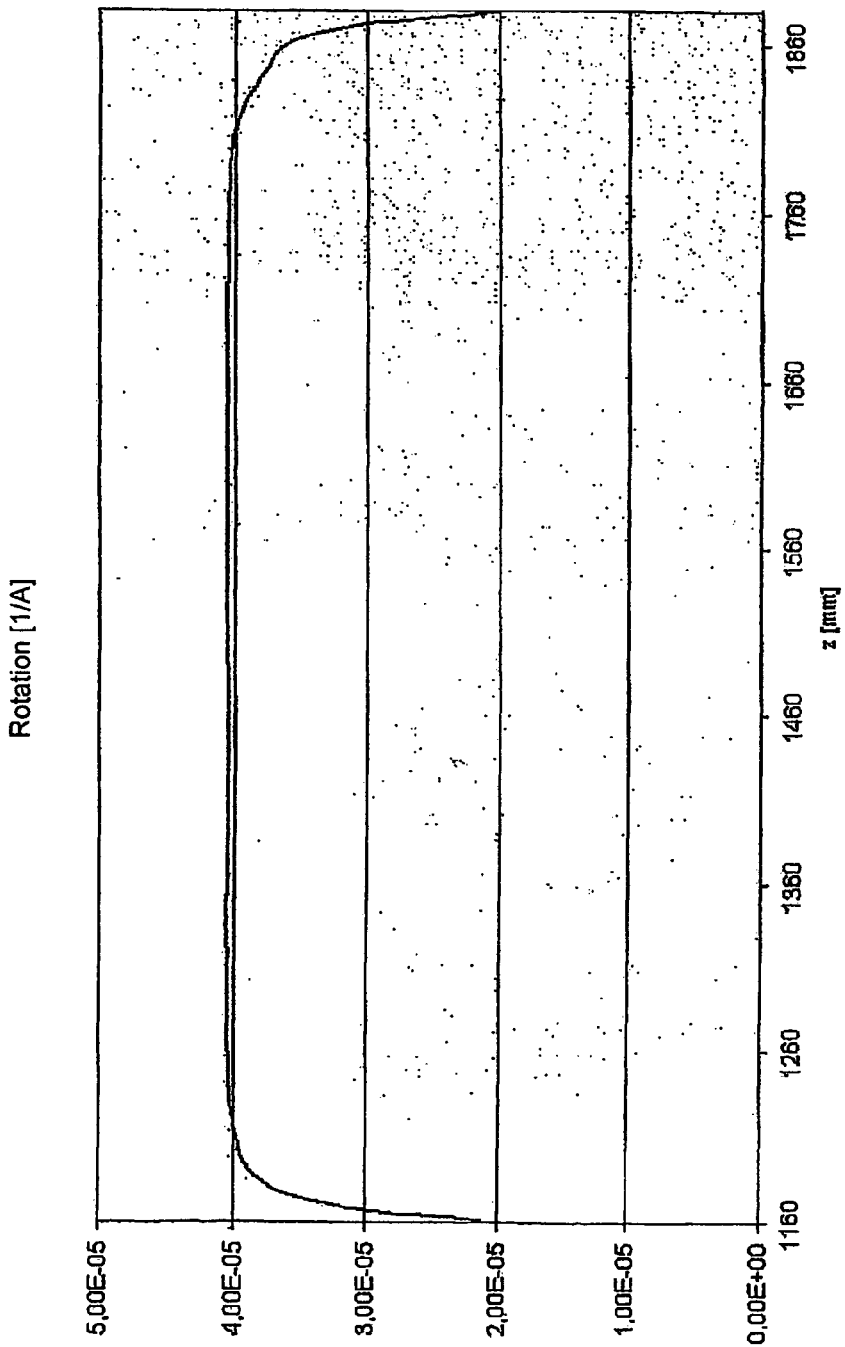
FIG. 6 shows the curve of the rotation sensitivity in different positions of a focusing lens stage.

The steps or stages of the correction lens system 22 are so constructed with respect to their position over the target 6 and number of turns that the focusing, imaging scale and rotation functions are decoupled to a great extent; i.e., when one of these parameters is adjusted, the other two remain unchanged as far as possible. The first correction lens pair 23 is responsible for the change in the imaging scale. The second correction lens pair 24 is responsible for the rotation of the image. The third correction lens pair 25 is responsible for the change in focusing. The curve of the focusing sensitivity, scale sensitivity and rotation sensitivity of a correction lens stage as a function of the height position of this stage over the target 6 can be utilized in an advantageous manner for this purpose. FIGS. 4, 5 and 6 show examples of such a curve.

FIG. 4 shows the focusing sensitivity as a function of the height position of a correction lens coil. The focusing of the corpuscular optical beam on the target 6 should be carried out chiefly by the third stage, since the focusing sensitivity has its maximum in the gap center of the second lens 20b.

FIG. 5 shows the change in the imaging scale. The change in the imaging scale should be carried out chiefly by the first correction lens pair 23 which is arranged in the maximum of the scale change sensitivity in the gap center of the first lens 20a.

Finally, the change in the beam rotation should be carried out chiefly by the second correction lens pair 24, whose height or distance from the target 6 is selected in such a way that the focusing and change in scale remain unchanged as far as possible. Accordingly, between the first lens 20a and second lens 20b of the particle optics projection system, the influence of the second correction lens pair 24 with respect to the rotation of the image field is constant.

Since the complete decoupling of the focusing, scale change and beam rotation functions by the selection of suitable distances of the correction lens pairs 23, 24 and 25 over the target 6 is only approximately successful, also owing in part to inevitable structural defects, the currents for the three correction lens pairs 23, 24 and 25 are determined from a system of equations which contains three independent variables for the effect of the currents on focusing, imaging scale and beam rotation. The relationship between focusing z, change in imaging scale M, change in rotation, and the three currents $I_1$, $I_2$ and $I_3$ of the correction lens stages is given by the following matrix equation:

$$\begin{pmatrix} \Delta z \\ \Delta M \\ \Delta \Theta \end{pmatrix} = \begin{pmatrix} a_{11} & a_{12} & a_{13} \\ a_{21} & a_{22} & a_{23} \\ a_{31} & a_{32} & a_{33} \end{pmatrix} * \begin{pmatrix} I_1 \\ I_2 \\ I_3 \end{pmatrix}$$

The exact coefficients for the coupling matrix are determined empirically by calibration. Further, it is possible that the relationship between z, M and the three currents $I_1$, $I_2$ and $I_3$ is nonlinear. In this case, polynomials must be used for the dependencies.

As can be seen from FIG. 3, each of the three correction lens pairs 23, 24 and 25 comprises a compensation coil 27 whose purpose is to sharply suppress the magnetic field toward the outside, that is, away from the axis 1. This inhibits the formation of eddy currents, e.g., in the iron of the pole piece 21 of the first magnetic lens 20*a* and second magnetic lens 20*b*. Further, hysteresis effects in the pole pieces 21 or other ferromagnetics (soft-magnetic ferrites) are minimized so that highly accurate and fast correction processes are made possible. In relation to the radii $R_{fl}$ of the respective correction coils 26, the radii $R_{kom}$ of the compensation coils 27 have a value for the ratio $$\frac{R_{kom}}{R_{fl}}$$

of between 1.5 and 3.0. The value for the ratio $$\frac{R_{kom}}{R_{fl}}$$

should preferably be two.

The distances of the compensation coils 27 over the target 6 should preferably correspond to the distance of the fast correction coils 26 of the correction lens system over the target 6. In this case, the optimal excitation NI (where N is the number of turns and I is the current) of the correction coils and compensation coils is subject to following simple condition:

$$\frac{NI_{kom}}{NI_{fl}} = \left(\frac{RI_{kom}}{RI_{fl}}\right)^2.$$

The directions of current flow in the compensation coils 27 and in the associated fast correction coils 26 are opposed.

Depending on the embodiment form and on the environment of the correction lens system 22, it may be useful to enclose the coils of the system more or less completely by soft-magnetic ferrites in order to suppress eddy currents in the pole pieces 21 of the first lens 20*a* and second lens 20*b* and other conductive parts of the particle optics projection system 20.

Figure 7:
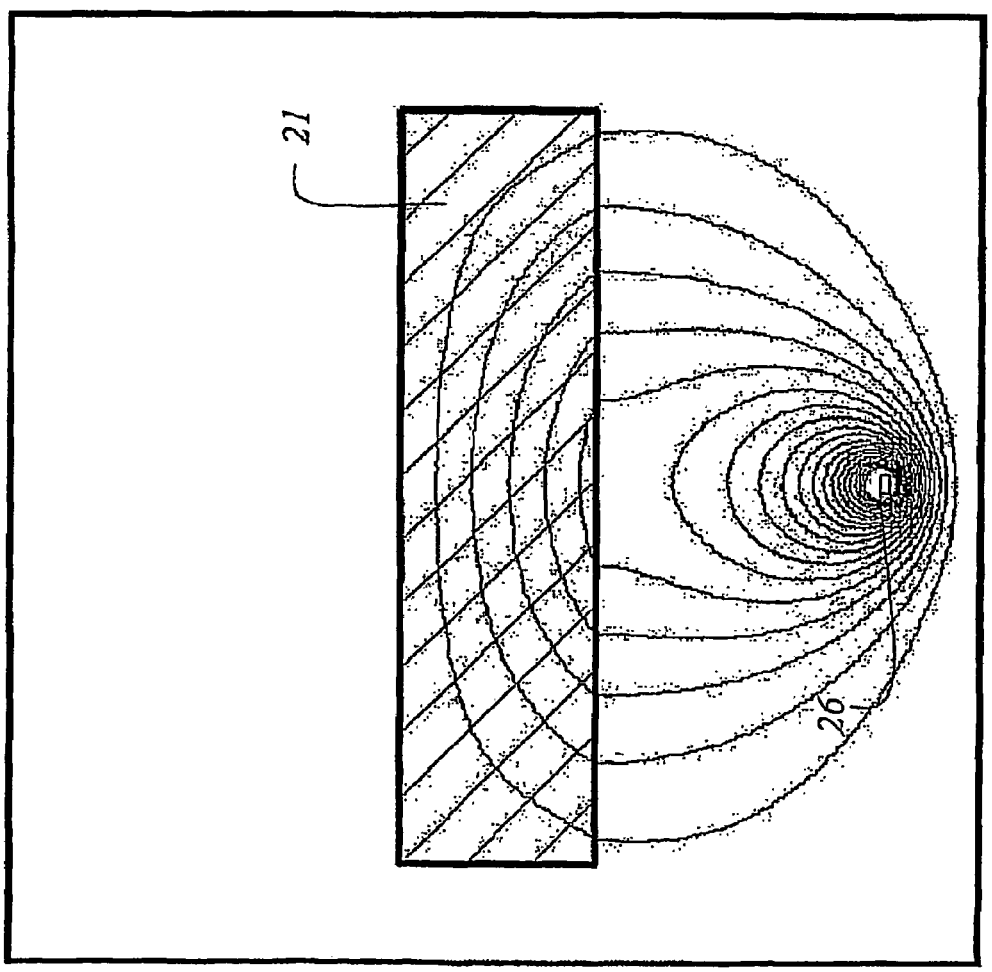
FIG. 7 illustrates the magnetic field in the environment of a correction lens.
Figure 8:
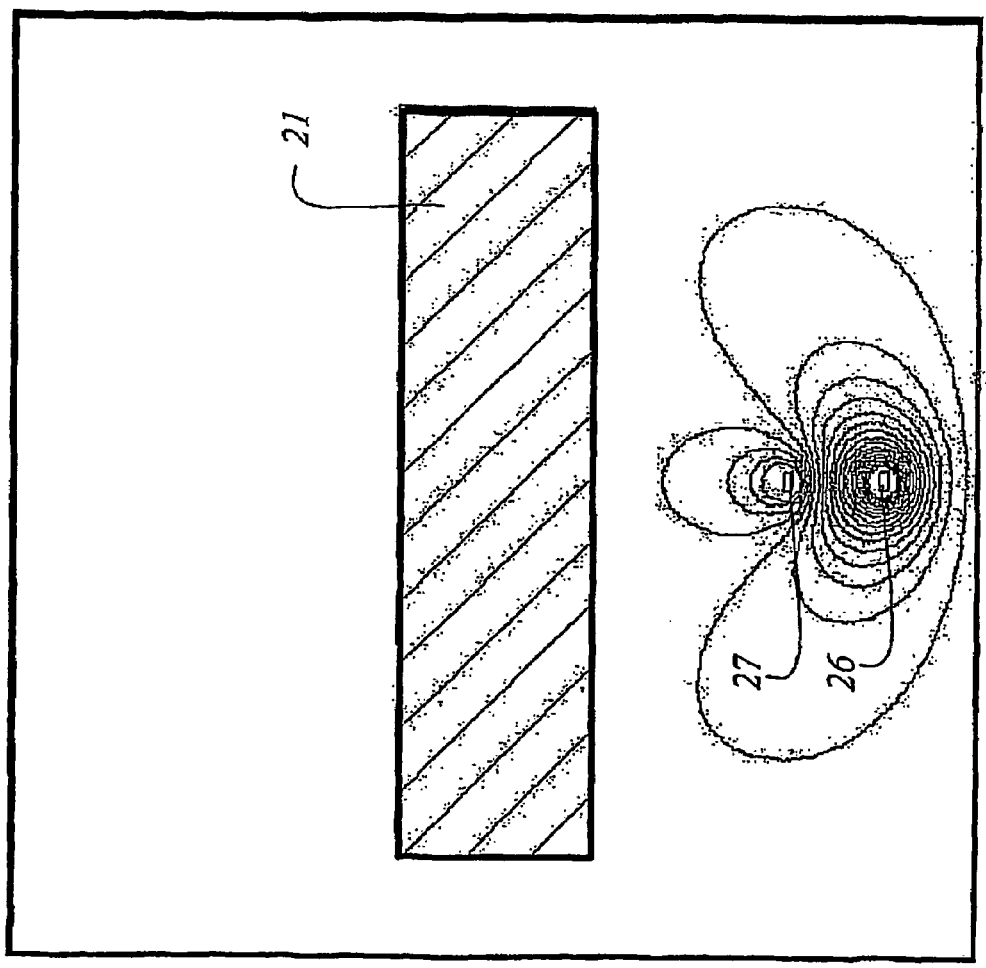
FIG. 8 illustrates the action of a compensation coil of a correction lens stage.

FIG. 7 and FIG. 8 illustrate the effect of a compensation coil 27 on the magnetic field of a correction coil 26. The summary magnetic field of both coils outside the compensation coil in radial direction is almost suppressed (FIG. 8) by the opposed current flow in the two coils, i.e., it does not further penetrate exterior metal parts 21.

While the foregoing description and drawings represent the present invention, it will be obvious to those skilled in the art that various changes may be made therein without departing from the true spirit and scope of the present invention.

The invention claimed is:

1. A correction lens system for a particle beam projection device comprising:
   at least a first magnetic lens;
   a second magnetic lens; and
   a plurality of correction lens pairs being arranged between the first magnetic lens and the second magnetic lens and the particle beam, wherein each correction lens pair comprises a fast correction coil and a compensation coil;
   wherein the correction coil of each correction lens pair is arranged closer to the particle beam than the compensation coil associated with the correction lens.

2. The correction lens system according to claim 1, wherein a first, a second and a third correction lens pair are provided.

3. The correction lens system according to claim 1, wherein focusing, imaging scale and rotation are adjustable independently in the particle optics projection device.

4. The correction lens system according to claim 1, wherein the individual compensation coils and the correction coils of each correction lens pair are constructed as air coils.

5. The correction lens system according to claim 1, wherein the compensation coils have a radius $R_{kom}$ and the correction coils have a radius $R_{fl}$, and in that the ratio of the radii $R_{kom}/R_{fl}$ has a value of between 1.5 and 3.0.

6. The correction lens system according to claim 5, wherein the value for the ratio of radii $R_{kom}/R_{fl}$ is two.

7. The correction lens system according to claim 1, wherein the coil pairs are externally shielded individually or jointly by ferrite rings in direction of the optical axis and/or by ferrite cylinders in radial direction.

\* \* \* \* \*